United States Patent [19]

Tange et al.

[11] Patent Number: 4,683,644
[45] Date of Patent: Aug. 4, 1987

[54] AUTOMATED ASSEMBLY SYSTEM FOR SEMICONDUCTOR DEVICE

[75] Inventors: Kohsuke Tange; Osamu Takahashi; Yuhki Furuya; Akira Harada, all of Tokyo, Japan

[73] Assignee: Oki Electric Industry Co., Ltd., Tokyo, Japan

[21] Appl. No.: 754,960

[22] Filed: Jul. 15, 1985

[30] Foreign Application Priority Data

Jul. 16, 1984 [JP] Japan ................... 59-146086

[51] Int. Cl.⁴ ............ H01L 21/58; H01L 21/60; B23P 21/00
[52] U.S. Cl. ................ 437/7; 29/740; 29/742; 437/220; 437/211
[58] Field of Search ......... 29/569 R, 574, 588, 29/589, 590, 740, 742, 791; 364/468, 513

[56] References Cited

U.S. PATENT DOCUMENTS 3,845,286 10/1974 Aronstein et al. ............. 364/468
3,889,355 6/1975 Aronstein et al. ............. 29/569 R
4,027,246 5/1977 Caccoma et al. ............... 364/468

Primary Examiner—Olik Chaudhuri
Attorney, Agent, or Firm—Wenderoth, Lind & Ponack

[57] ABSTRACT

To automatic assembly of a semiconductor device, a robot having 6 degrees of freedom is provided for effecting conveyance among prior automated devices. The robot includes a readout means for reading an identification number of a magazine for housing lead frames therein for identifying each magazine. The robot also includes a sampling station for quality control within the working range thereof. The robot includes a control means for storing magazines drawn out for quality control. Accordingly, no disturbance is produced in article flows among the component devices. The system further includes an inputting means for inputting a lot number of lead frames within the magazines. Thus, lots are reliably controlled because of one-to-one correspondence between the lot number and the identification number of the magazine.

2 Claims, 5 Drawing Figures

AUTOMATED ASSEMBLY SYSTEM FOR SEMICONDUCTOR DEVICE

BACKGROUND OF THE INVENTION

The present invention relates to an automated assembly system for a semiconductor device for automatizing manufacture thereof.

Semiconductor devices such as ICs are manufactured by use of:

(a) a die bonder for mounting an IC die on a lead frame, (b) a wire bonder connecting the die and the lead frame via a wire, (c) a molding device for sealing the wire bonded die with resin, (d) a heating and hardening furnace for heating and hardening the molded resin, (e) a cutter for cutting and bending a lead part projecting from the molded part, and (f) a soldering means for coating the lead part with solder. Each of these devices incorporates a magazine filled with lead frames from an inlet thereof, automatically takes out the lead frames one at a time for assembly work thereon, and houses processed lead frames in an exit magazine. Conveyances between the magazines are, however, conducted manually. Accordingly, there may be produced some undesirable possibilities of errors caused by such human participation.

Conventionally, there have been devised many systems each for consistently effecting some processes required for semiconductor manufacture such as a die bonding process, a wire bonding process, and a resin molding process. Employing such an automated system, a complete semiconductor device can be obtained from the outlet thereof only by incorporating lead frames from the inlet thereof. Such systems, however, suffer from the following drawbacks:

(1) Drawing out any magazine in the midst of processing, from the system for quality control, the magazine is separated away from an original lot, resulting in cumbersome difficulties in performing quality control of lots. Namely, to return the drawn magazine to the original lot it is necessary to stop processing for the parental lot and to await the completion of a quality control process, or to manually return the magazine to the original lot.

(2) Successive performance of respective processes in series causes overall throughput to be limited by a latest process, thereby unbalancing those processes.

(3) Since the system is consistently operated, any trouble produced at any one portion thereof requires the entire system to be stopped for its repair.

Different from repairs for individual devices, the repair described above is very complicated and cumbersome.

SUMMARY OF THE INVENTION

It is an object of the present invention to provide an automated semiconductor assembly system capable of facilitating sampling testing.

Another object of the present invention is to provide an automated semiconductor assembly system with large throughput.

According to the present invention there is provided an automated semiconductor assembly system, comprising: a plurality of automated devices for automatically conducting at least one among a plurality of semiconductor assembly processes; a robot having 6 degrees of freedom provided among said automated devices for conveying magazines, each housing lead frames therein, among said devices. The system includes: a gripper mechanism for gripping said magazine; a sensor means provided in the vicinity of said gripper mechanism for reading out an identification number on said magazine; a sampling station provided within a working area of said robot having 6 degrees of freedom, for quality control; a means for inputting a lot number of the lead frames housed in each of the magazines; and a control means for storing pieces of information from said sensor means and said inputting means to control products and for controlling said plurality of automated devices and said robot having 6 degress of freedom.

The above and other objects, features and advantages of the present invention wil become more apparent from the following description when taken in conjunction with the accompanying drawings in which a preferred embodiment of the present invention is shown by way of illustrative example.

DETAILED DESCRIPTION OF THE PREFERRED EMBODIMENT

With reference to the accompanying drawings, a preferable embodiment of the present invention will be described below.

Figure 1:
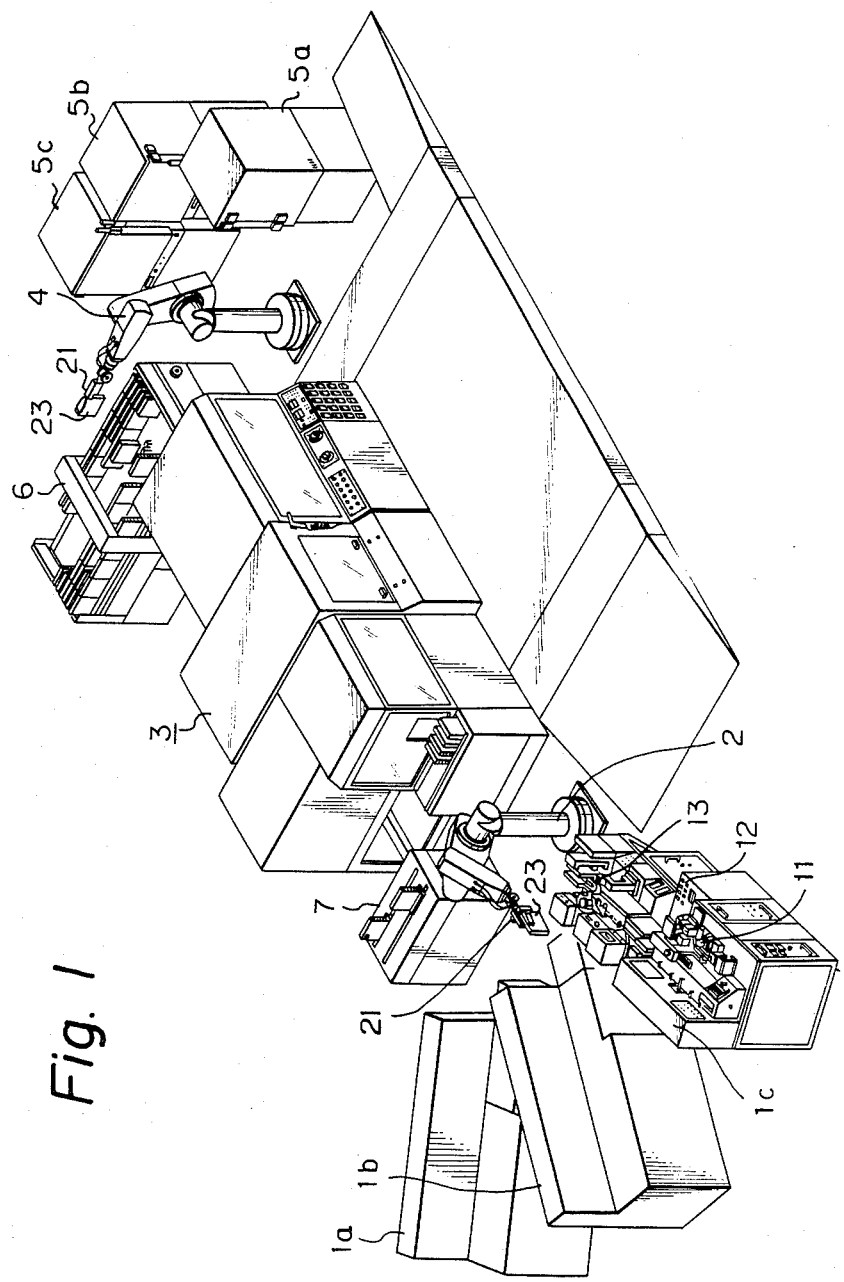
FIG. 1 is a schematical perspective view illustrating one portion of an embodiment of the present invention.

FIG. 1 is a schematical perspective view illustrating one embodiment of the present invention.

A system of the embodiment comprises three die bonders or wire bonders 1a to 1c, two robots 2 and 4, each having 6 degress of freedom, an automated molding device 3, three heating and hardening furnaces 5a to 5c, an IC magazine classifying station 6, a sampling station 7, and a control device (not illustrated).

Each device described above will be described below in detail in the order of the processes of manufacturing a semiconductor device.

Figure 2A:
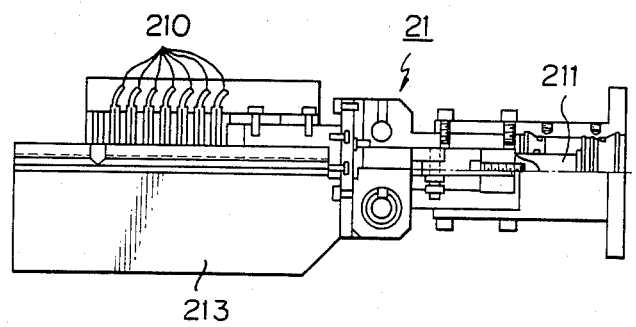
FIGS. 2(a) and 2(b) are enlarged views of a gripper portion of a robot having 6 degrees of freedam showing a side view thereof in FIG. 2(a) and a plan thereof in FIG. 2(b)
Figure 2B:
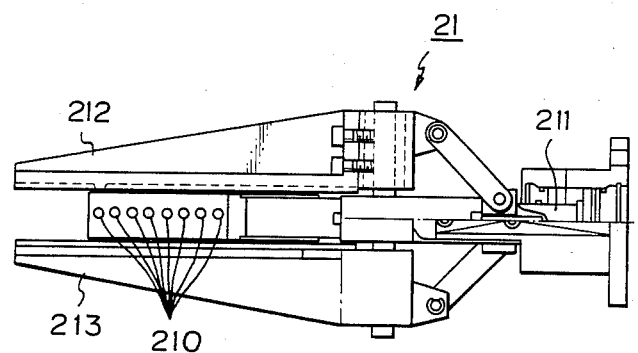
Figure 3:
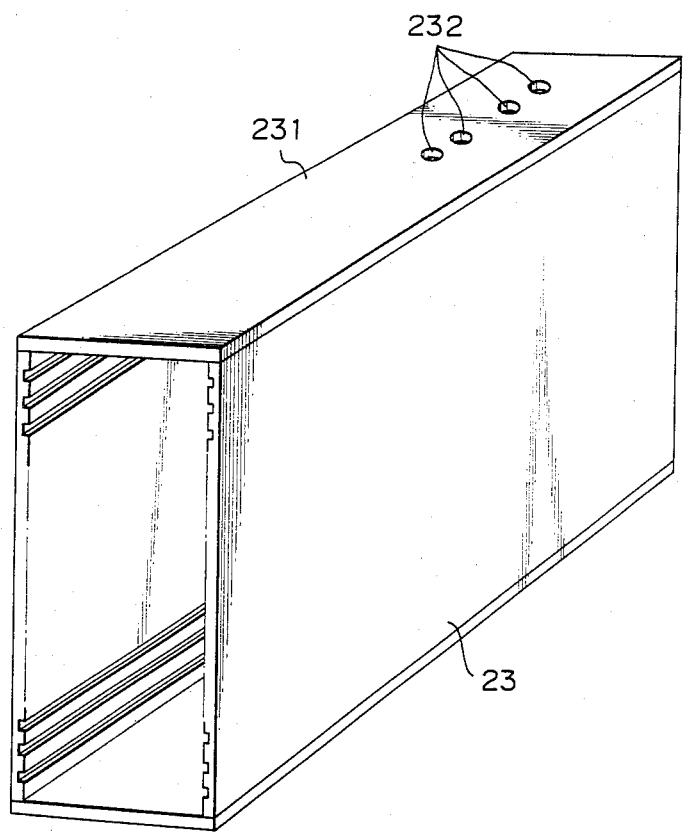
FIG. 3 is a perspective view of a magazine.

The die bonders and the wire bonders 1a to 1c (partly illustrated) respectively include thereon die tray supply parts 11, key boards 12 for inputting lot numbers, and housing magazine elevators 13. Each of the die bonders or wire bonders 1a to 1c bonds an IC die on the lead frame (for die bonding), and this IC die is connected with a lead portion of the lead frame via a wire (for wire bonding). The lead frame thus constructed is housed in the magazine 23. A robot 2 having 6 degrees of freedom is installed in the vicinity of the three die bonders and wire bonders 1a–1c. The robot 2 conveys the magazine 23 from one of the die bonders and wire bonders 1a to 1c to the automated molding device 3 or the sampling station 7. The robot 2 has a conventional body 20 and consequence provided with a gripper portion 21, and is capable of holding the gripper part 21 within the working area thereof at a three-dimensionally arbitrary position and angle (thus having a total of 6 degrees of freedom. The gripper part 21 is, as shown in FIGS. 2(a) and 2(b), constructed such that a pair of gripping pieces 212, 213 are opened and closed by the operation of an air cylinder 211. In addition, there is provided a reflecting sensor 210 for reading out an identification number of the magazine 23 between the gripping pieces 212, 213. The magazine 23 includes holes 232 provided through a top surface plate 231 as shown in FIG. 3. The holes 232 are represent in binary digits the aforesaid identification number. The automated molding device 3 and the sampling station 7 are provided within the working area of the robot 2 having 6 degress of freedom together with the die bonders and the wire bonders 1a to 1c. The sampling station 7 quality-controls diebonded and wirebonded lead frames. The automated molding device 3 seals (molds) the diebonded and wirebonded lead frames with resin.

For the lead frames molded in the automated molding device 3, the molded resin is heated and hardened in heating and hardening furnaces 5a–5c. The robot 4 and having 6 degrees of freedom is also used to convey the magazine 23 housing the lead frames from the automated molding device 3 to the heating and hardening furnaces 5a to 5c. The robot 4, similarly to robot 2, has a conventional body 20 and a gripper part 21. There is provided an IC magazine classifying station 6 within the working area of the robot 4 having 6 degrees of freedom in addition to the automated molding device 3 and the heating and hardening furnaces 5a to 5c. Arranged in parallel on the IC magazine classifying station 6 are the magazines 23 housing the lead frames already processed in the heating and hardening furnaces 5a to 5c.

Figure 4:
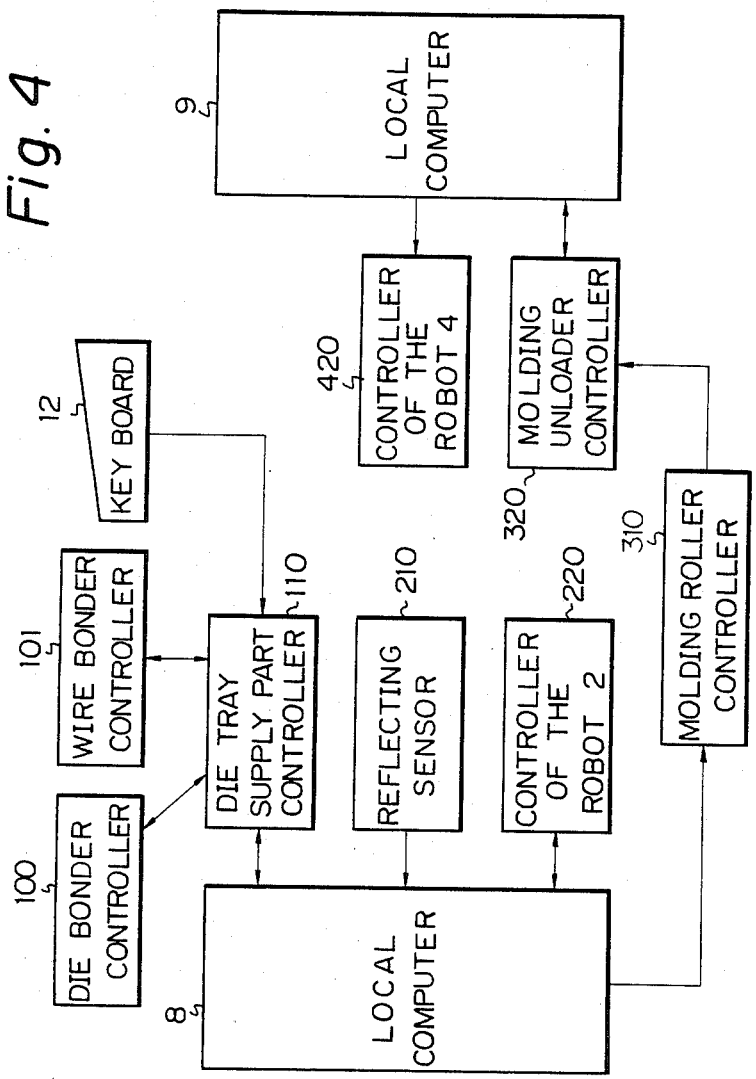
FIG. 4 is a block diagram of a control device.

With reference to a block diagram of the control device shown in FIG. 4, operations of the system in the present embodiment will be described below in detail.

Description of the block diagram

A local computer 8 controls devices arranged around the robot 2 having 6 degrees of freedom. The local computer 8 is connected with a die tray supply part controller 110 included in a die tray supply part 11, the reflecting sensor 210 of the robot 2 having 6 degrees of freedom, a controller 220 of the robot 2, and a molding roller controller 310 included in the automated molding device 3. The die tray supply part controller 110 is also connected with the key board 12, the die bonder controller 100, and the wire bonder controller 101. Although there are actually employed three die tray supply part controllers 110, key boards 12, die bonder controllers 100, and wire bonder controllers 101, they are omitted to simplify the explanation.

A local computer 9 controls devices arranged around the robot 4 having 6 degrees of freedom. The local computer 9 is connected with the molding roller controller 310, a molding unloader controller 320 included in the automated molding device 3, and a controller 420 of the robot 4 having 6 degrees of freedom.

Description of the Operation

A tray on which dies to be bonded are put side-by-side is set to the die tray supply part 11, and a lot number thereof is inputted from a key board 12. This information is transferred from the die tray supply part controller 110 to the local computer 8. With a start switch depressed, the die bonder controller 100 sends out a tray changeover request signal to the die tray supply part controller 110. By this signal, the die tray supply part 11 supplies the tray, and with the completion of this supply the die tray supply part controller 110 issues a complete signal to the bonder controllers 100 and 101. By this complete signal, the die bonders and wire bonders 1a to 1c start to operate. Namely, lead frames are diebonded and in succession wirebonded. With the completion of these operations, the lead frames are housed in order in the magazine 23 placed on a housing magazine elevator 13. Filled with the lead frames in the magazine 23, the wire bonder controller 101 sends a magazine changeover request signal to the die tray supply part controller 110. The signal is transferred to the local computer 8 via the die tray supply part controller 110. The local computer 8 sends an operation signal to a controller 220 of the robot 2 having 6 degrees of freedom. By this signal the robot 2 stops at a position where it can read out holes 232 indicating the identification numbers of the magazines. The controller 220 of the robot 2 then sends out a positioning completion signal to the local computer. The local computer 8 instructs the reflecting sensor 210 mounted on the gripper part of the robot 2 to read the identification number (holes 232) of the magazine 23. In succession, it compares a previously inputted lot number with the read-out identification number, and stores them. Thereafter, the local computer 8 sends an operation instruction signal to the controller 220 of the robot 2. With this signal, the robot 2 grips the magazine 23, and conveys it to the sampling station 7 where it is supported and quality tasted or the automated molding device 3 where it is molded. This conveyance condition is transmitted from the sampling station 7 to the computer 8. Thereby, the local computer 8 instructs to the robot 2 whether the magazine 23 should be conveyed to the sampling station 7 or the molding device 3. Further, this selection can be executed without relying on an instruction from the sampling station 7. Namely, it may be also possible to previously convey the whole number of the magazines 23 to the sampling station 7 or an arbitrary number of magazines 23 (for example, a first magazine, or a magazine instructed by an operator who conducts a quality control check, etc.) to the sampling station 7.

When the magazines 23 are conveyed to the automated molding device 3, the local computer 8 transfers the lot number of the magazines to the molding loader controller 310. The molding loader controller 310 puts the lot number in a control queue. When processing's turn comes around, the automated molding device 3 draws out only lead frames from the magazines to process them in succession. The mold loader controller 310 sends the lot number to the mold unloader controller 320. With the completion of processing in the automated molding device 3, the lead frames are again housed in a magazine 23 (this magazine 23 differs from the previous one). In addition, the mold unloader controller 320 sends an operation instruction request signal for the robot 4 having 6 degrees of freedom to the local computer 9. By this signal, the local computer 9 sends an operation signal to a controller 420 of the robot 4 for operating the robot 4. The magazine 23 is conveyed by the robot 4 to the heating and hardening furnaces 5a–5c, and heated and hardened for a prescribed period of time. After a prescribed time, or after adequate heating, the robot 4 takes out the magazine 23 from the heating and hardening furnaces 5a to 5c in response to a signal from the local computer 9, and conveys it to the IC magazine classifying station 6 for being arranged in a completion queue. The IC magazine classifying station 6 conveys the magazine 23 conveyed by the robot 4 from the heating and hardening furnaces 5a through 5c to the operator side, which recieves the lot number thereof from the local computer 9 and displays it.

When the magazine 23 is conveyed to the sampling station 7, the local computer 8 stores an identification number of the conveyed magazine 23 read by the reflecting sensor 210. The conveyed magazines 23 are automatically moved by the the sampling station 7 toward an inspection station (not illustrated).

This inspection station inspects lead frames contained in the magazine 23 with visual observation by or an inspecting machine operated by, an operator. After these inspections, the magazine 23 is automatically moved toward the robot 2 by the sampling station 7, which further transmits a conveyance request to the local computer 8, the robot 2 conveys the magazine 23 based on a signal from the local computer 8 from the sampling station 7 to the automated molding device 3. After the inspection, the magazine 23 is conveyed by the robot 2 from the sampling station 7 to the automated molding device 3. The local computer 8 compares the identification number of the magazine 23 read from the reflecting sensor 210 with that already stored. Consequently, the inspected magazines 23 may be returned to the sampling station 7 in an arbitrary order.

Although the sampling station 7 was provided in the present embodiment between the die bonders and wire bonders 1a to 1c, and the automated molding device 3, it may be arranged among the processes already sampled.

In addition, inputting means such as a key board and the like, and switches may be provided together at positions easy to operate. Further, although a system for reading the identification number of the magazine 23 was constructed so as to read out holes provided through the magazine, by the reflecting sensor, any other methods may be employed.

According to the present invention, intermediates can be automatically conveyed by the robot having 6 degrees of freedom, enabling labor saving to be realized in semiconductor manufacturing processes.

In addition, there is provided an inputting means for an article lot number, and an identification number is indicated on a magazine for housing said intermediates. A sensor is provided on said gripping mechanism for reading said identification number, while a computer is provided for controlling articles based on said read-out lot number and identification number. Accordingly, a consistent flow of the articles is automatically controlled. Particularly, even if there are some factors disturbing the article flow such as a sampling inspection, etc., lots can be securely controlled since identification numbers and lot numbers of magazines are controlled solely by a computer. Thus, the present invention can be applied to a system in which various kinds of articles are produced in a small quantity.

In addition, according to the present invention, intermediates can be conveyed among devices by increasing the number of the devices each having lower processing speeds as compared with that of the devices each having faster processing speeds. Consequently, the devices in respective processes can be operated with maximum throughputs. Moreover, said conveying mechanism a higher degree of freedom so that its use is not limited to positioning the articles among the devices, simplifying assembling work.

What is claimed is:

1. An automated semiconductor assembly system, comprising:

die bonding means for mounting an IC die on a lead frame;

receiving, connecting and inserting means for receiving the frame from the die bonding means, connecting the IC die to a lead portion of the lead frame with a wire to form an unmolded semiconductor product, and inserting the unmolded semiconductor product into a magazine having holes formed in a plate thereof, the holes representing in binary digits an identification number of the magazine;

first support means for supporting the unmolded semiconductor product during a period of quality checking;

molding means for sealing the unmolded semiconductor product in a resin to form an unhardened molded product;

first robot means for roboticly transferring the magazine from one to another of said receiving, connected and inserting means, said first support means and said molding means, said first robot means including a first reflecting sensor for reading out the identification number of the magazine;

heating and hardening means for heating the magazine and the molded product therein to harden the unhardened molded product into a hardened molded product;

second support means for supporting the magazine;

second robot means for roboticly transferring the magazine from one means selected from the group of said molding means, said heating and hardening means and said second support means to another means selected from said group in response to a transfer instruction, said second robot means having a second reflecting sensor for reading out the identification number of the magazine;

control means, communicating with each of said die bonding means, said receiving, connecting and inserting means, said molding means, said first and second supporting means, said first and second robot means and said heating and hardening means, for controlling each of said die bonding means, said receiving, connecting and inserting means, said molding means, said first and second supporting means, said first and second robot means and said heating and hardening means, and for correlating the identification number of the magazine with a lot number of the lead frame in the magazine which lot number is input to the control means, and storing the correlation of the lot number and the identification number in said control means; and means for inputting the lot number into said control means.

2. A system as in claim 1, wherein said control means includes a first local computer and a second local computer, said first local computer including means, communicating with said die bonding means, said receiving, connecting and inserting means, said first support means, said molding means and said inputting means, for determining a first transfer route of the magazine between one and another of said receiving, connecting and inserting means, said first support means and said molding means, and transmitting a first transfer instruction indicative of the first transfer route so determined to the first robot means, said second local computer including means, communicating with said molding means, said heating and hardening means and said second support means, for determining a second transfer route of the magazine between one and another of said molding means, said heating and hardening means and said second support means, and transmitting a second transfer instruction indicative of the second transfer route so determined to said second robot means.

* * * * *